United States Patent
Song et al.

(10) Patent No.: US 8,501,268 B2
(45) Date of Patent: Aug. 6, 2013

(54) METHODS OF FORMING MATERIAL OVER A SUBSTRATE AND METHODS OF FORMING CAPACITORS

(75) Inventors: Zhe Song, Boise, ID (US); Chris M. Carlson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 820 days.

(21) Appl. No.: 12/720,305

(22) Filed: Mar. 9, 2010

(65) Prior Publication Data

US 2011/0223320 A1 Sep. 15, 2011

(51) Int. Cl.
- *C23C 16/455* (2006.01)
- *C23C 16/00* (2006.01)
- *C23C 16/44* (2006.01)

(52) U.S. Cl.
USPC ............... 427/79; 427/58; 427/123; 427/124; 427/126.1; 427/248.1; 427/255.23; 427/255.7; 427/255.28; 438/239; 438/253; 438/785; 257/E21.008; 257/E21.16; 257/E21.17

(58) Field of Classification Search
None
See application file for complete search history.

(56) References Cited

U.S. PATENT DOCUMENTS

| | | | |
|---|---|---|---|
| 6,420,230 B1 | 7/2002 | Derderian et al. | |
| 6,730,163 B2 | 5/2004 | Vaartstra | |
| 6,863,725 B2 | 3/2005 | Vaartstra et al. | |
| 7,018,469 B2 | 3/2006 | Li et al. | |
| 7,056,784 B2 | 6/2006 | Bhat et al. | |
| 7,067,438 B2 | 6/2006 | Derderian et al. | |
| 7,077,902 B2 | 7/2006 | Vaartstra | |
| 7,094,690 B1 | 8/2006 | Sandhu et al. | |
| 7,119,034 B2 | 10/2006 | Derderian et al. | |
| 7,125,815 B2 | 10/2006 | Vaaertstra | |
| 7,135,369 B2 | 11/2006 | Ahn et al. | |
| 7,151,039 B2 | 12/2006 | Lee et al. | |
| 7,192,888 B1 | 3/2007 | Mercaldi | |
| 7,217,615 B1 | 5/2007 | Derderian et al. | |
| 7,258,895 B2 | 8/2007 | Sandhu | |
| 7,329,615 B2 | 2/2008 | Derderian et al. | |
| 7,368,014 B2 | 5/2008 | Doan | |
| 7,378,129 B2 | 5/2008 | Kraus et al. | |
| 7,393,736 B2 | 7/2008 | Ahn et al. | |
| 7,431,966 B2 | 10/2008 | Derderian et al. | |
| 7,442,415 B2 | 10/2008 | Conley et al. | |
| 2006/0251813 A1* | 11/2006 | Carlson et al. ............. | 427/248.1 |
| 2009/0004779 A1 | 1/2009 | Kuratomi et al. | |
| 2009/0047798 A1 | 2/2009 | Clark et al. | |

* cited by examiner

*Primary Examiner* — Nathan Empie
*Assistant Examiner* — Lisha Jiang
(74) *Attorney, Agent, or Firm* — Wells St. John, P.S.

(57) ABSTRACT

A method of forming a material over a substrate includes performing at least one iteration of the following temporally separated ALD-type sequence. First, an outermost surface of a substrate is contacted with a first precursor to chemisorb a first species onto the outermost surface from the first precursor. Second, the outermost surface is contacted with a second precursor to chemisorb a second species different from the first species onto the outermost surface from the second precursor. The first and second precursors include ligands and different central atoms. At least one of the first and second precursors includes at least two different composition ligands. The two different composition ligands are polyatomic or a lone halogen. Third, the chemisorbed first species and the chemisorbed second species are contacted with a reactant which reacts with the first species and with the second species to form a reaction product new outermost surface of the substrate.

37 Claims, 11 Drawing Sheets

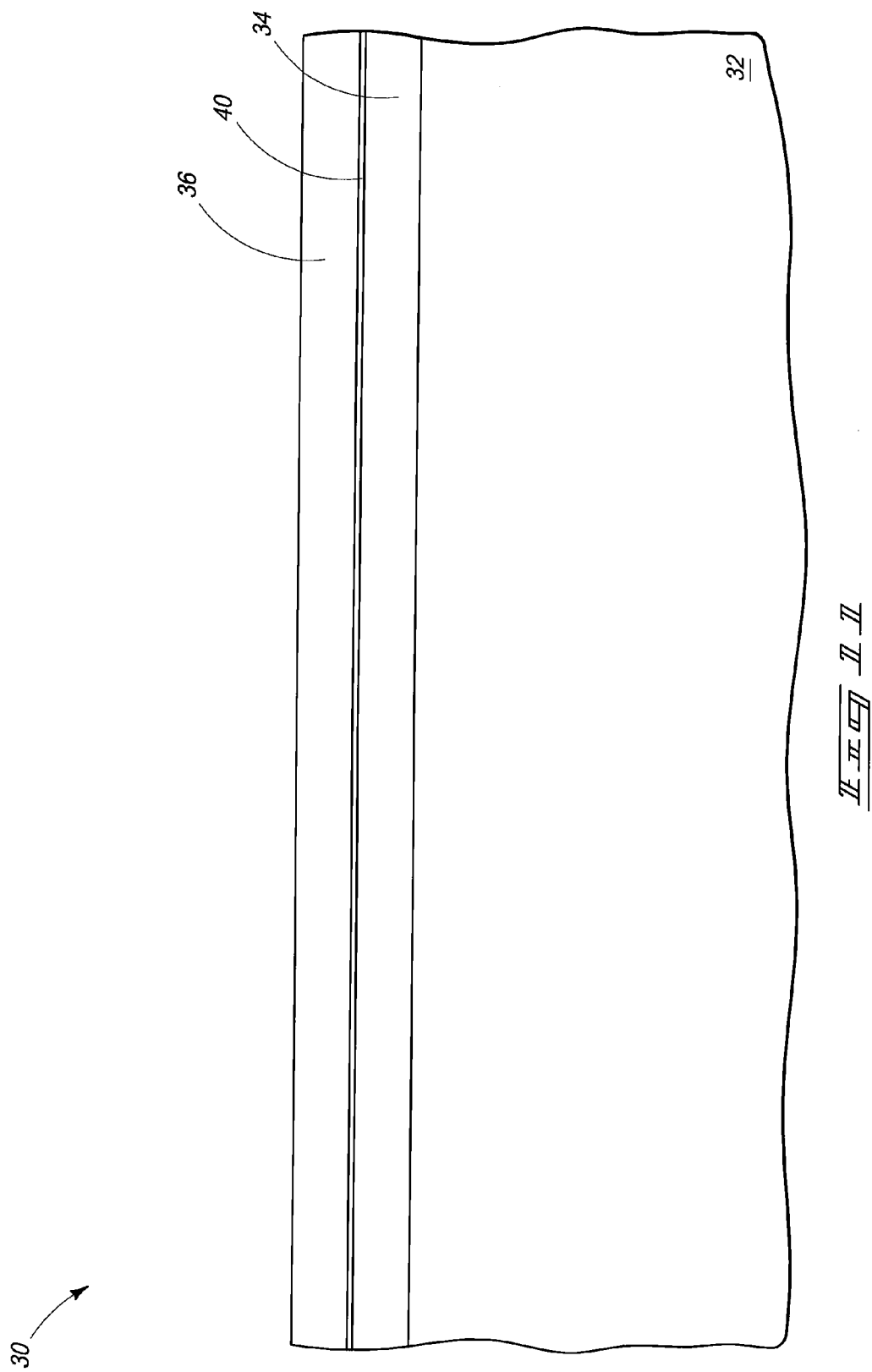

US 8,501,268 B2

METHODS OF FORMING MATERIAL OVER A SUBSTRATE AND METHODS OF FORMING CAPACITORS

TECHNICAL FIELD

Embodiments disclosed herein pertain to methods of forming material over a substrate and to methods of forming capacitors.

BACKGROUND

Various technologies have been developed for applying thin films over substrates, and particularly for applying thin films during fabrication of devices of integrated circuitry. Such technologies include chemical vapor deposition (CVD) and atomic layer deposition (ALD). Both ALD and CVD use volatile precursor materials to form a desired material onto a substrate. CVD and ALD differ from one another, however, in that CVD includes reaction of precursors in vapor or plasma phase over a substrate which then forms a deposit onto the substrate. ALD, on the other hand, comprises chemisorption of a precursor component onto a substrate followed by a reaction involving the chemisorbed component to form a desired deposit onto the substrate.

ALD has been used to deposit dielectrics for capacitors, for example oxides such as aluminum oxide, hafnium oxide, and zirconium oxide. In some instances, such oxides are deposited to include multiple different metals and/or metalloids, for example $Hf_xAl_yO_z$, $Zr_xAl_yO_z$, and $Zr_xSi_yO_z$. The majority metal component of such materials often provides the desired predominant property of the film, for example Hf or Zr for high dielectric constant. The minority metal component may be provided to offset an undesired characteristic contributed by the majority metal component, for example providing Al or Si to reduce leakage current. Accordingly, it is desirable to be able to carefully control the respective quantity of each respective metal/metalloid in a multiple metal/metalloid dielectric.

BRIEF DESCRIPTION OF THE DRAWINGS

FIG. 11 is a diagrammatic sectional view of a substrate processed in accordance with an embodiment of the invention.

DETAILED DESCRIPTION OF EXAMPLE EMBODIMENTS

First embodiments of methods of forming a material over a substrate 10 are described with reference to FIGS. 1-4. Substrate 10 may comprise a semiconductor or other substrate, and regardless may be homogenous or non-homogenous comprising multiple different composition regions and/or layers. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 comprises substrate material 12 that has some outermost surface 14. Substrate material 12 may or may not be homogenous, and outermost surface 14 may or may not be planar. For example, outermost surface 14 may undulate and/or comprise different raised and/or recessed features (not shown).

An embodiment of a method of forming a material over a substrate comprises performing at least one iteration of the following temporally separated ALD-type sequence involving at least the following first, second, and third stated acts upon the substrate. Additional processing may occur before, intermediate, or after the stated acts, with reference to first, second, and third throughout this document only requiring temporal order relative to one another in an iteration. Further, "ALD-type" refers to technologies that are either true ALD processes or that are more similar to ALD processes than to other deposition processes, as is described in U.S. Patent Application Publication No. 2006/0251813 which is fully incorporated by reference as if included in its entirety herein.

Figure 1:
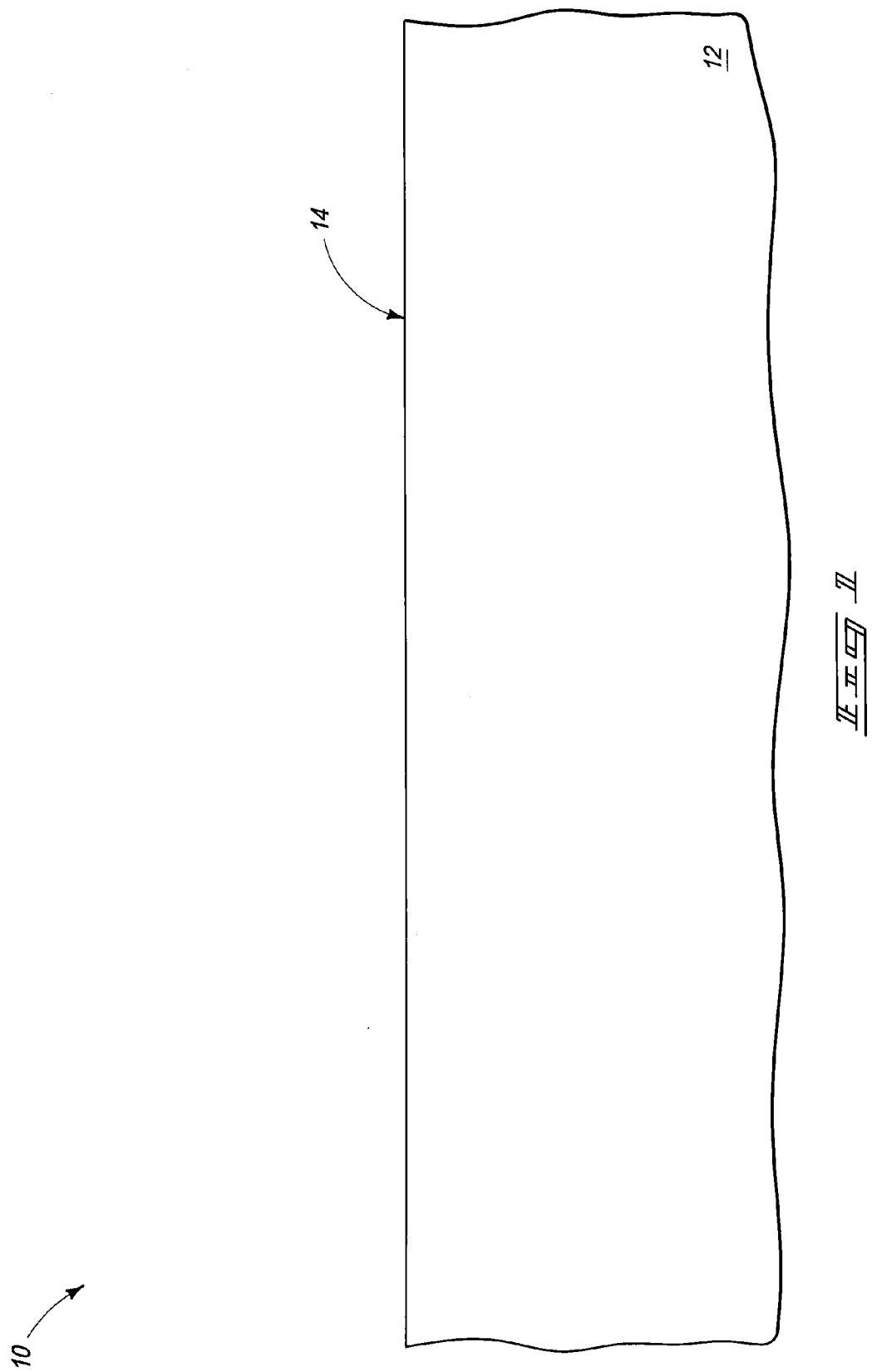
FIG. 1 is a diagrammatic sectional view of a substrate in process in accordance with an embodiment of the invention.
Figure 2:
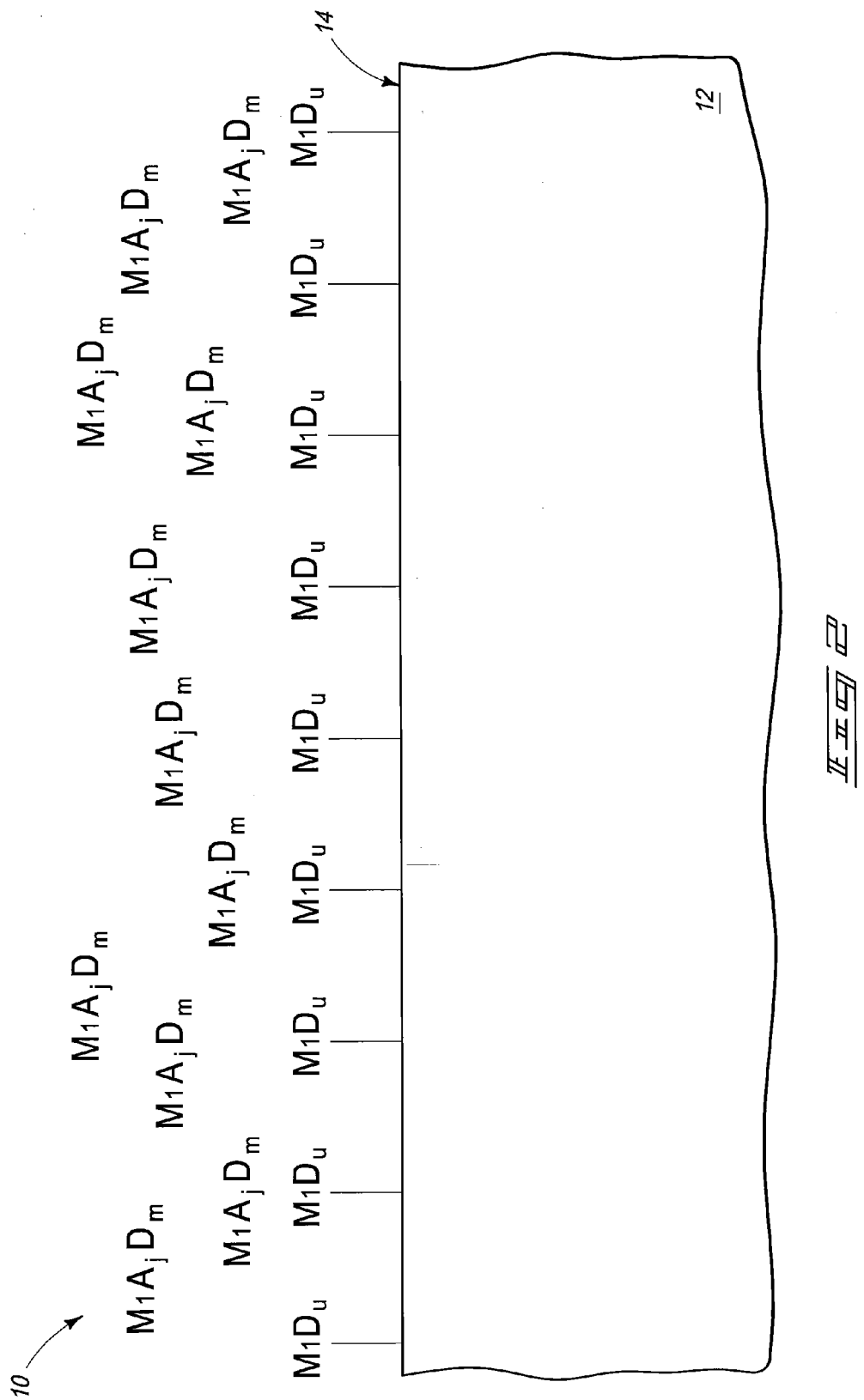
FIG. 2 is a view of the FIG. 1 substrate at a processing step subsequent to that of FIG. 1.

In a first part of an iteration of one embodiment, and referring to FIG. 2, outermost surface 14 of substrate 10 has been contacted with a first precursor to chemisorb a first species onto outermost surface 14 from the first precursor. The first precursor comprises a central atom and at least two different composition ligands which are either polyatomic or a lone halogen. Additional composition ligands may be included as long as at least two are at least one of polyatomic or a lone halogen. In one embodiment, at least one of the different composition ligands is polyatomic, and in one embodiment at least one of the different composition ligands is a lone halogen. In one embodiment, at least two of the different composition ligands are different lone halogens. In one embodiment, at least two of the different composition ligands are polyatomic, and in one embodiment none of the different compositions is a lone halogen. In one embodiment, all of the ligands of the first precursor are of only two different compositions, and in one embodiment the ligands of the first precursor are of more than two different compositions.

The first species may or may not be equally spaced relative one another on the outermost surface to which such chemisorb. Further, the first species may or may not saturate such outermost surface taking into consideration the available outermost surface bonding sites in combination with the steric effect/hindrance of the ligand(s) remaining bonded to the central atoms. Ideally, saturation or near-saturation of the outermost surface by the first species is achieved.

FIG. 2 depicts an example first precursor $M_1A_jD_m$, where $M_1$ is a central atom and A and D are two different composition ligands which are either individually polyatomic or a lone halogen. The central atom may or may not be a "metal"

element as defined in U.S. Patent Application Publication No. 2006/0251813. The suffixes "j" and "m" are numbers greater than zero, may be the same or different, and may or may not be integers. The central atom of the first precursor may be monovalent, bivalent, trivalent, or tetravalent, with "j" and "m" totaling 1, 2, 3, or 4, respectively. The central atom of the first precursor may be higher than tetravalent, with "j" and "m" thereby totaling more than 4. The first precursor may or may not be stoichiometric. FIG. 2 depicts a chemisorbed first species $M_1D_u$, where the suffix "u" is a number equal to or less than "m", is greater than zero, and may or may not be an integer. Accordingly by way of example only, FIG. 2 depicts an embodiment wherein the first precursor includes only two different composition ligands and the first species includes only one of the two different composition ligands. Alternately, some A ligands may remain as part of the first species.

In one embodiment, the first precursor has greater quantity of one of the two different composition ligands than the other of the two different composition ligands, and in one embodiment in such instance the first species may be void of the one ligand. In one embodiment, one of the different composition ligands in the first precursor is larger than all remaining ligands in the first precursor of different composition from the one ligand, and the first species comprises more of the one ligand than any of the remaining ligands. In such instance, the first species may be void of the remaining ligands or include one or more of the remaining ligands. Where at least one of the different composition ligands is polyatomic, such by way of example may be any of alkyl, allyl, alkoxy, amino, amido, imido, cyclic, aromatic, alicyclic, heterocyclic, or polycyclic.

Specific polyatomic ligands include the following, and their derivatives: methyl, ethyl, isopropyl, n-butyl, isobutyl, tert-butyl, neopentyl, cyclopentadienyl, methoxy, ethoxy, isopropoxy, isobutoxy, tert-butoxy, 1-methoxy,2-methyl,2-propoxy, dimethylaminoethoxy, acetylacetonato; 2,2,6,6-tetramethyl,3,5-heptanedionato, 1,1,1,5,5-hexafluoroacetylacetonato, octane-2,4-dionato, 1-(2-methoxyethoxy)-2,2,6,6-tetramethyl,3,5-heptanedionato, 2-amino pent-2,en-4-onato, acetox, dimethylamido, ethylmethylamido, diethylamido, bis(trimethyl-silyl)amido; tert-butylimido, N,N'-diisopropyl-acetamidinato, N,N'-ditertbutylacetamidinato, 1,10-phenanthroline, dimethylglyoximato, diethyldithio-carbamato, aryloxy, amidinate, β-diketonate, ketoiminate, amine, silanoate; carboxylate, ether, furan, pyridine, pyrole, pyrrolidine, glyme, nitrile, to name a few by way of example only.

In a second part of the iteration, the outermost surface is contacted with a second precursor to chemisorb a second species onto the outermost surface. The second species is different from the first species. The second precursor comprises a central atom and ligands, with the central atoms of the first and second precursors being different. The second precursor may or may not comprise at least two different composition ligands and, if so, one or more of the different composition ligands may or may not be the same as the at least two different composition ligands of the first precursor. Regardless, in one embodiment, one of the ligands of the first precursor may be larger than each ligand in the second precursor.

Figure 3:
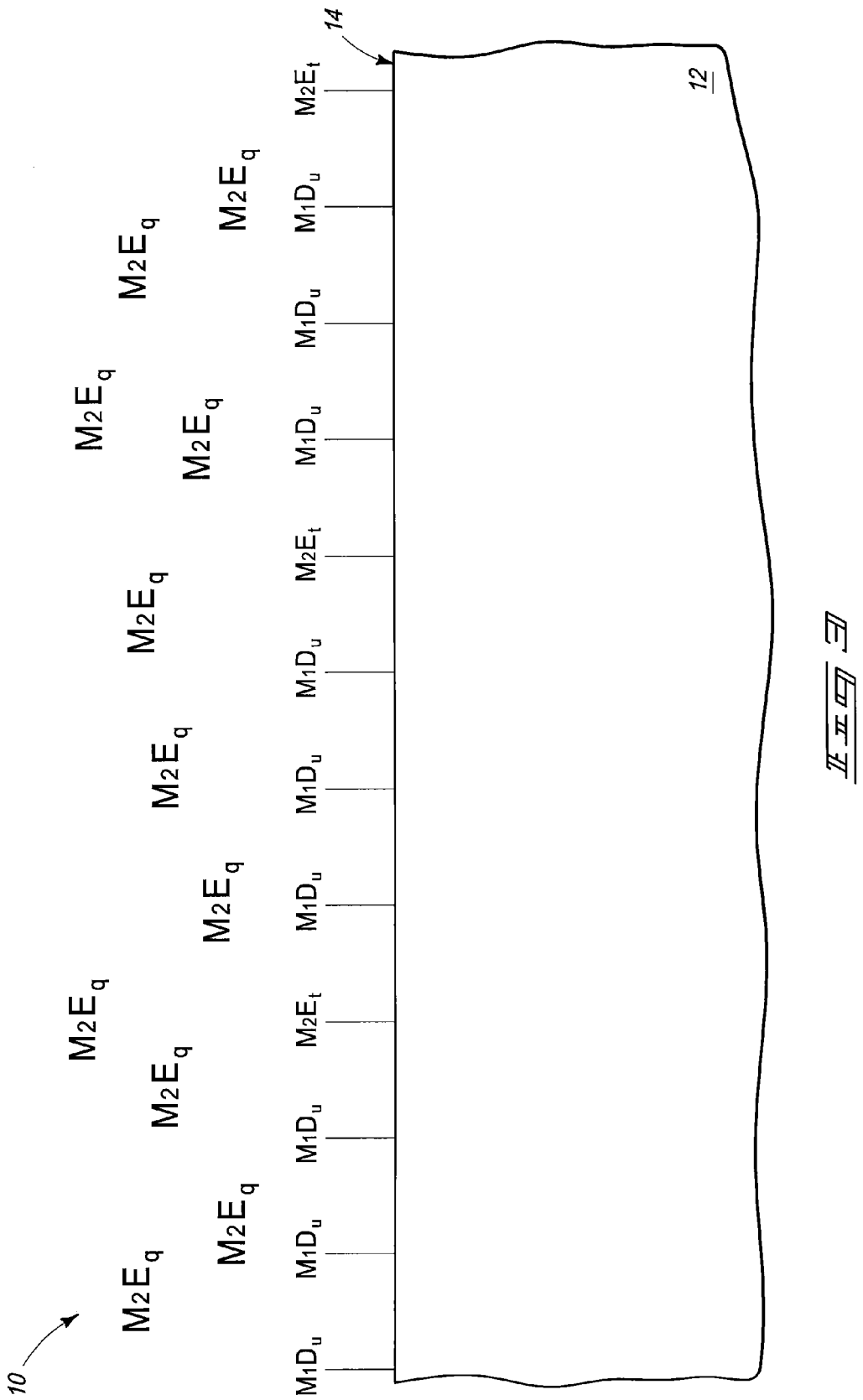
FIG. 3 is a view of the FIG. 2 substrate at a processing step subsequent to that of FIG. 2.

FIG. 3 depicts an example embodiment wherein the second precursor is represented as $M_2E_q$, wherein all of the ligands E of the second precursor are of the same composition. The central atom $M_2$ may or may not be a "metal" element as defined in U.S. Patent Application Publication No. 2006/0251813. The suffix "q" is some number greater than zero, and may or may not be an integer. The central atom of the second precursor may be of any valence, and the second precursor may or may not be stoichiometric. The second species chemisorbed onto outermost surface 14 is represented as $M_2E_t$, where "t" is some number less than "q", is greater than zero, and may or may not be an integer. Example ligands E include any of those described above with respect to the first precursor. However ideally, the compositions of D and E are different. The combination of the chemisorbed first and second species of FIG. 3 may or may not result in a saturated or near-saturated monolayer. Regardless, the chemisorbed second species may or may not be largely equally spaced relative to one another and/or relative to the chemisorbed first species. Regardless, the quantity of the chemisorbed second species may be greater or less than the chemisorbed first species. Ideally, such will be less than the chemisorbed first species. For simplicity, FIG. 3 shows a ratio of first species to second species of 3:1, with uniform ordering and equal spacing of the respectively adhered species. Such exact ordering and spacing would be unlikely in practice.

Figure 4:
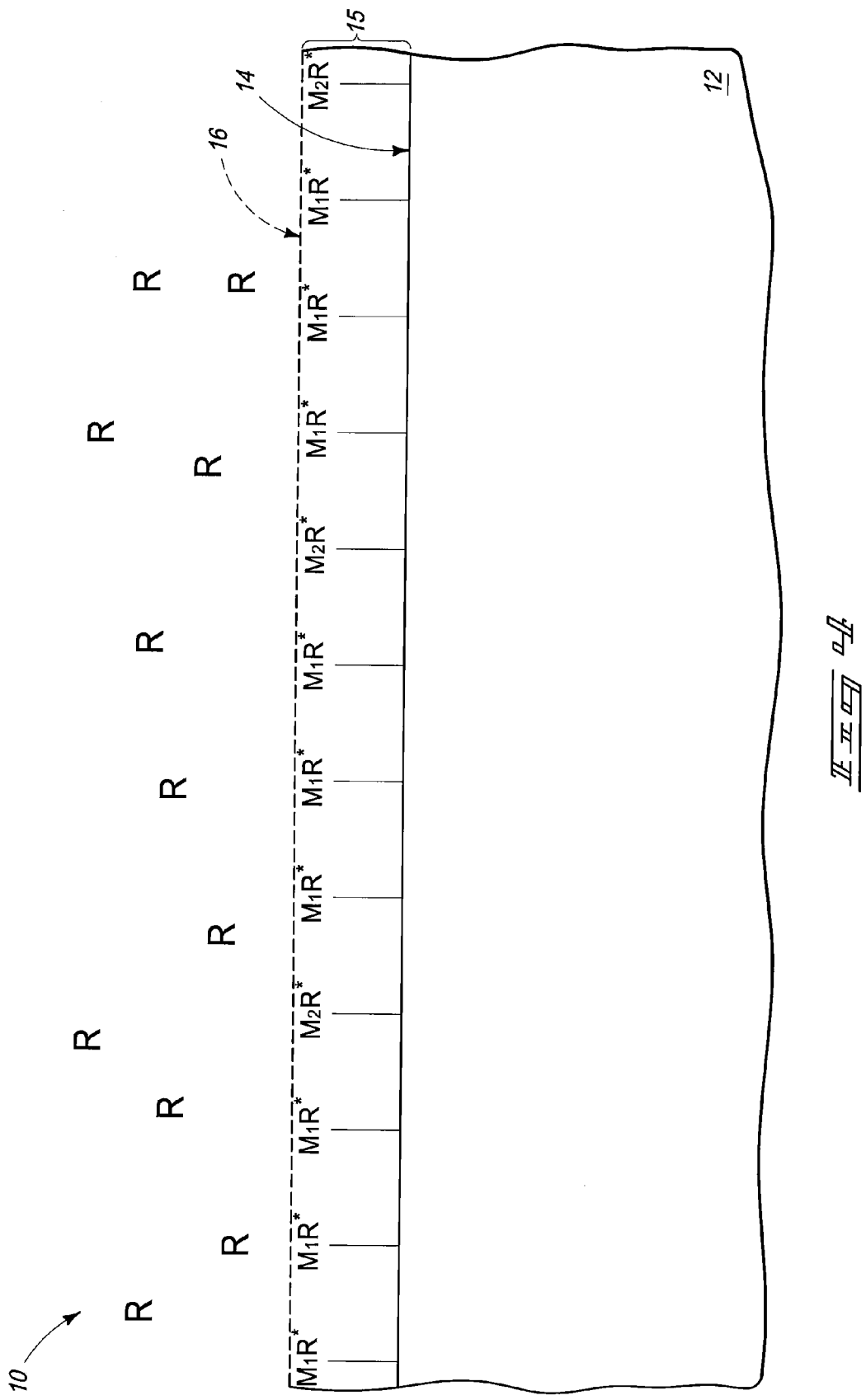
FIG. 4 is a view of the FIG. 3 substrate at a processing step subsequent to that of FIG. 3.

In a third part of the iteration, and referring to FIG. 4, the chemisorbed first species (not shown) and the chemisorbed second species (not shown) are contacted with a reactant R which reacts with the first species and with the second species to form a reaction product 15 and a new outermost surface 16 of substrate 10. Composition of reaction product 15 is exemplified by a combination of $M_1R^*$ and $M_2R^*$, where $R^*$ is some component of reactant R. Alternately considered, the reaction product may be collectively considered or represented as $M_{1x}M_{2y}R^*_z$. The reactant may, by ways of example only, comprise oxygen, nitrogen, or silicon to convert the chemisorbed material of FIG. 3 to a desired composition such as, for example, an oxide, a nitride, or a silicide, respectively.

Suitable pump and/or purge steps may occur before or after any of the above first, second, and third parts.

The above iteration may be repeated one or more times whereby new outermost reaction product surfaces are created to ultimately achieve a suitable desired thickness of material over substrate material 12. Additionally and/or alternately, another precursor having the same or different central atom with respect to one of the first and second precursors could be used immediately before or after exposure to the reactant. Regardless, other processing may occur before or after any of the first, second, and third parts of the above iteration. Further, the reaction product of different iterations may be different depending on precursors which are used.

The invention may enable, although not necessarily require, taking advantage of the steric effect/hindrance of different composition ligands in the first precursor to better control desired quantity of $M_1$ and $M_2$ in the example deposited $M_{1x}M_{2y}R^*_z$. material. For example, where the first species retains a large ligand from the first precursor in comparison to size of each ligand in the second precursor, a lower quantity of the first species may be chemisorbed onto the outermost substrate surface providing more bonding sites on the outermost surface for the second species. In other words, the presence of the larger ligands of the first species, due to steric effect or steric hindrance, reduces the number of available bonding sites for the first species. This provides more bonding sites when the second precursor contacts the same outermost surface, particularly where the ligands of the second precursor are all smaller than the individual ligand(s) remaining in the first species. Further, the first species may more tenaciously adhere to the outermost surface where the first species only contains one or more large ligands whereby the first species is less likely to be displaced from the outermost surface by the act of exposing the substrate to the second precursor. In one ideal embodiment, the first species retains only a single polyatomic ligand from the first precursor, with such single ligand being larger than all individual ligands of the second precursor. Further ideally in such embodiment, the single ligand is cyclic and/or all individual ligands of the second precursor are smaller than the single polyatomic ligand of the first precursor and/or all ligands of the second precursor are of the same composition. Ideal control and results have been achieved where the first species retains only a single cyclic ligand, and all ligands of the second precursor are of the same composition which is not cyclic and is smaller than the single cyclic ligand of the first species.

Regardless, in one embodiment where one of the ligands in the first precursor is larger than each ligand in the second precursor and the first species comprises the one ligand, steric hindrance is used in forming the first species to reduce saturation of the central atom of the first precursor chemisorbed to the outermost surface than would otherwise occur under identical process conditions using a different first precursor not having such one ligand. Subsequently, the forming of the second species from the second precursor increases quantity of the central atom of the second precursor chemisorbed to the outermost surface than would otherwise occur when forming the first species under said identical process conditions using a different first precursor not having said one ligand.

Figure 5:
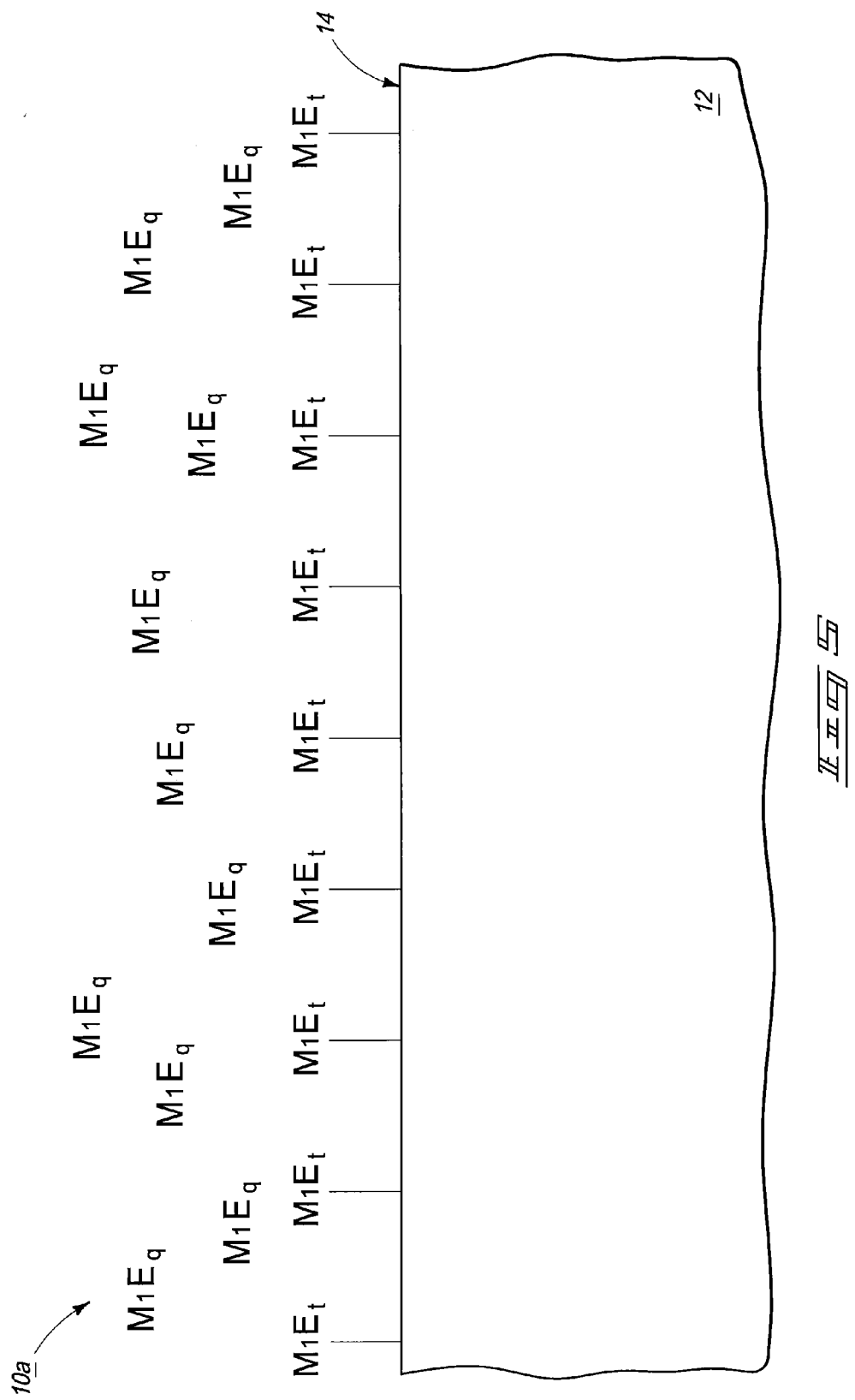
FIG. 5 is a diagrammatic sectional view of a substrate in process in accordance with an embodiment of the invention.

The above embodiments of FIGS. 1-4 used a first precursor that comprised at least two different composition ligands that are at least one of polyatomic or a lone halogen independent of whether the second precursor had multiple different composition ligands. An alternate embodiment is described with reference to FIGS. 5-7 wherein the second precursor requires at least two different composition ligands which are at least one of polyatomic or a lone halogen. Such alternate embodiment is independent of whether the first precursor includes multi-composition ligands, with FIG. 5 showing the first precursor to comprise only one composition ligand. Like numerals from the first-described embodiment are utilized where appropriate, with differences being indicated with different letters or with the suffix "a" for substrate 10a. In FIG. 5, the outermost surface 14 of the substrate has been contacted with a first precursor $M_1E_q$ to chemisorb a first species $M_1E_t$ onto outermost surface 14 of substrate 10a. By way of example, ligand E and suffix "q" may be as described above in the FIGS. 1-4 embodiment.

Figure 6:
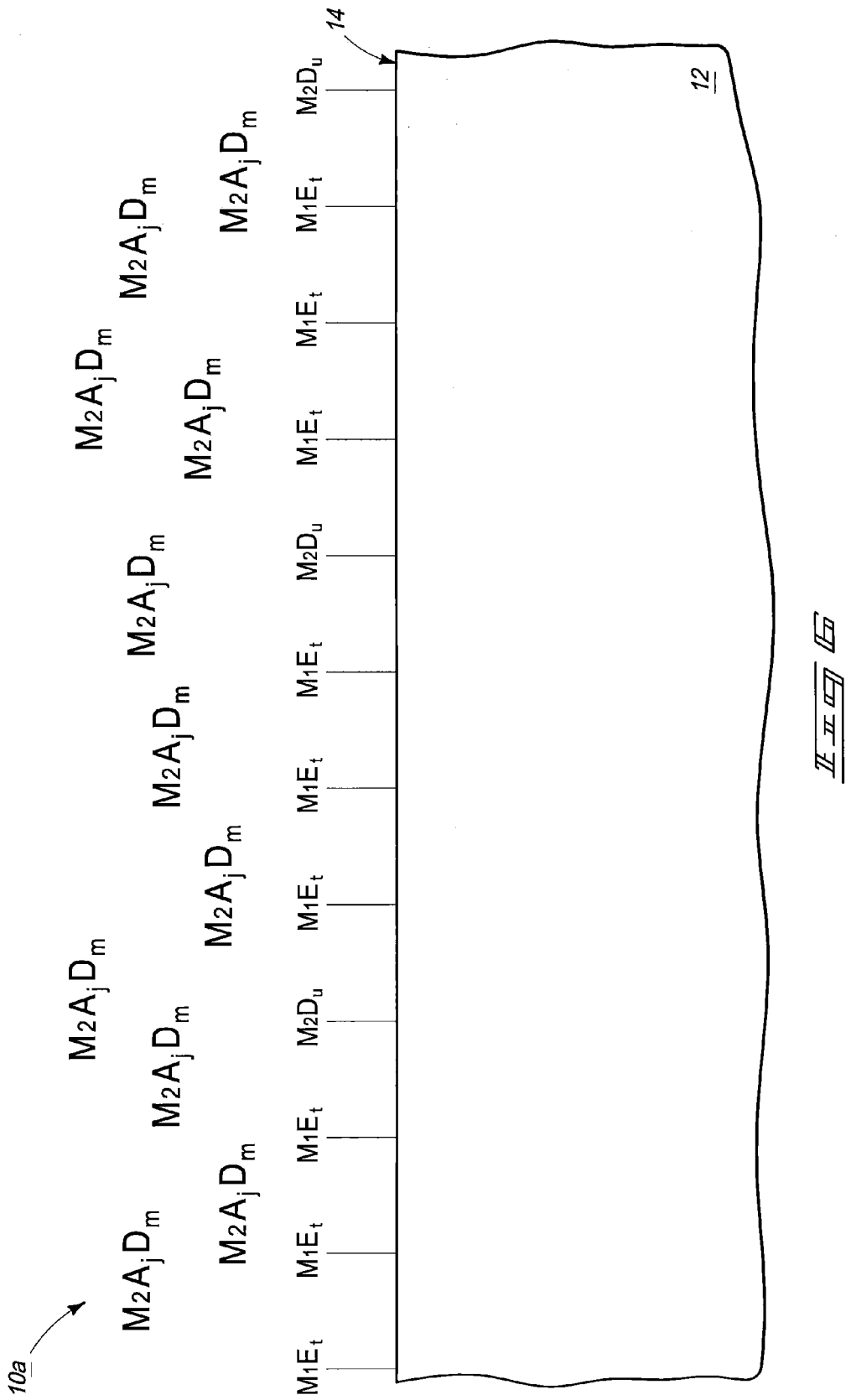
FIG. 6 is a view of the FIG. 5 substrate at a processing step subsequent to that of FIG. 5.

Referring to FIG. 6, outermost surface 14 has been contacted with a second precursor $M_2A_jD_m$ to chemisorb a second species $M_2D_u$ onto outermost surface 14. $M_2D_u$ is different from first species $M_1E_t$. The second precursor comprises a central atom and at least two different composition ligands which are at least one of polyatomic or a lone halogen, and with the central atoms of the first and second precursors being different. Example properties and attributes of the second precursor, including ligands A and D, and suffixes "j", "m", and "u", may be the same as those described above with respect to the first precursor in the first embodiment.

Figure 7:
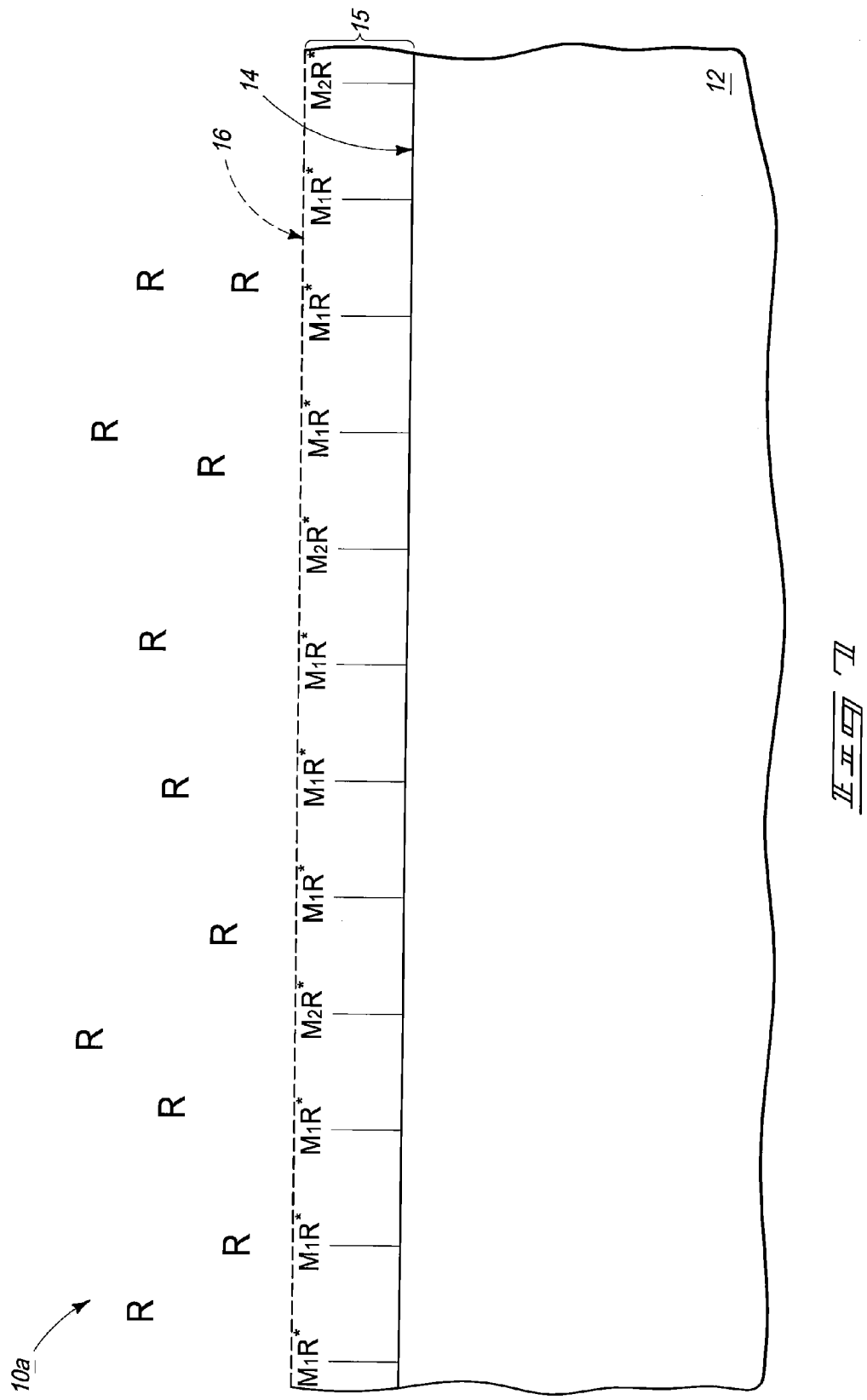
FIG. 7 is a view of the FIG. 6 substrate at a processing step subsequent to that of FIG. 6.

Referring to FIG. 7, the chemisorbed first species (not shown) and the chemisorbed second species (not shown) have been contacted with a reactant R which reacts with the first species and with the second species to form a reaction product 15 and a new outermost surface 16 of substrate 10a. By way of example, R may be the same as that described above in the FIGS. 1-4 embodiments. Likewise, the reaction product may be the same or different as that of FIG. 4. Further, the FIGS. 5-7 iteration may be repeated one or more times whereby new outermost reaction product surfaces are created to ultimately achieve a suitable desired thickness of material over substrate material 12. Additionally and/or alternately, another precursor having the same or different central atom with respect to the first and second precursors could be used immediately before or after exposure to the reactant. Regardless, other processing may occur before or after any of the first, second, and third parts of the above iteration. Further, the reaction product of different iterations may be different depending on precursors which are used.

An embodiment of the invention encompasses a method of forming a material over a substrate comprising performing at least one iteration of the following temporally separated ALD-type sequence. First, an outermost surface of a substrate is contacted with a first precursor to chemisorb a first species onto the outermost surface from the first precursor. Second, the outermost surface is contacted with a second precursor to chemisorb a second species different from the first species onto the outermost surface from the second precursor. The first and second precursors comprise ligands and have different central atoms. At least one of the first and second precursors comprises at least two different composition ligands which are at least one of polyatomic or a lone halogen. Third, the chemisorbed first species and the chemisorbed second species are contacted with a reactant which reacts with the first species and with the second species to form a reaction product outermost surface of the substrate. Each of the example FIGS. 1-4 and the FIGS. 5-7 embodiments are an example such method.

In one embodiment, only one of the first and second precursors comprises at least two different composition ligands.

In one embodiment, the deposited material comprises $Zr_xAl_yO_z$, one of the first or second precursors is tri(dimethylamino)cyclopentadienyl-zirconium, the other of the first and second precursors is trimethylaluminum, and the reactant comprises oxygen. In one example of such embodiment where the one precursor may comprise the first precursor, x is greater than y. In another example of such embodiment where the one precursor may comprise the second precursor, y is greater than x.

As a specific example, a plurality of silicon substrates having a 10 to 12 Angstroms thick outer layer of native oxide was loaded into a furnace. Chamber temperature during processing was 275° C., and chamber pressure was between 0.1 Torr and 0.2 Torr during gas flow to the chamber. Forty iterations were repeated of a first precursor pulse, then pump down, then inert $N_2$ flow, then second precursor pulse, then pump down, then inert $N_2$ flow, then reactant pulse, then pump down, and then $N_2$ flow. Where the first precursor was tri(dimethylamino)cyclopentadienyl-zirconium, the second precursor was trimethylaluminum, and the reactant was $O_3$, the ratio of zirconium oxide to aluminum oxide was about 4:1 and the thickness was 59 Angstroms inclusive of the native oxide. Where the first precursor was trimethylaluminum, the second precursor was tri(dimethylamino)cyclopentadienyl-zirconium, and the reactant was $O_3$, the ratio of aluminum oxide to zirconium oxide was about 6.5:1 and the thickness was 58 Angstroms inclusive of the native oxide.

As another example where the material comprises $Zr_xSi_yO_z$, one of the first or second precursors is tri(dimethylamino)cyclopentadienyl-zirconium, the other of the first and second precursors is tri(dimethylamino)silane, and the reactant comprises oxygen. In one example of such embodiment where the one precursor may comprise the first precursor, x is greater than y. In another example of such embodiment where the one precursor may comprise the second precursor, y is greater than x.

As a specific example, a plurality of silicon substrates having a 10 to 12 Angstroms thick outer layer of native oxide was loaded into a furnace. Chamber temperature during processing was 275° C., and chamber pressure was between 0.1 Torr and 0.2 Torr during gas flow to the chamber. Forty iterations were repeated of a first precursor pulse, then pump down, then inert $N_2$ flow, then second precursor pulse, then pump down, then inert $N_2$ flow, then reactant pulse, then pump down, and then $N_2$ flow. Where the first precursor was tri(dimethylamino)cyclopentadienyl-zirconium, the second precursor was tri(dimethylamino)silane, and the reactant was $O_3$, the ratio of zirconium oxide to silicon oxide was about 16:1 and the thickness was 59 Angstroms inclusive of the native oxide. Where the first precursor was tri(dimethylamino)silane, the second precursor was tri(dimethylamino)cyclopentadienyl-zirconium, and the reactant was $O_3$, the ratio of silicon oxide to zirconium oxide was about 3:1 and the thickness was 56 Angstroms inclusive of the native oxide.

Figure 8:
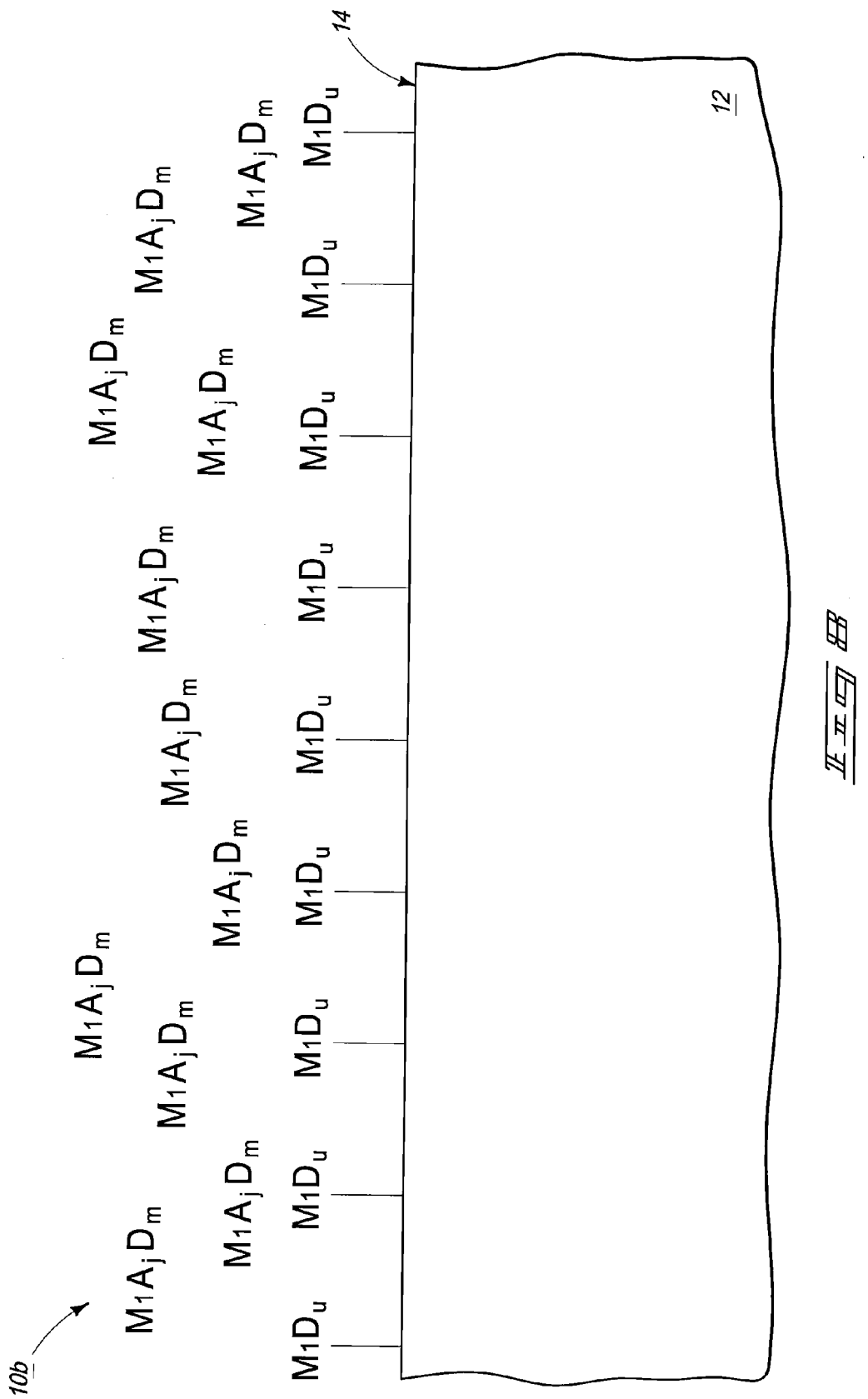
FIG. 8 is a diagrammatic sectional view of a substrate in process in accordance with an embodiment of the invention.

As another example embodiment, both the first and second precursors may comprise at least two different composition ligands which are at least one of polyatomic or a lone halogen. Such is shown by way of example in FIGS. 8-10 with respect to a substrate 10b. Like numerals and letters have been used from the above-described embodiment, with differences being indicated with different letters or with the suffix "b" for substrate 10b. First, and referring to FIG. 8, outermost surface 14 of substrate 10b has been contacted with a first precursor $M_1A_jD_m$ to chemisorb a first species $M_1D_u$ onto outermost surface 14 from the first precursor. The first precursor comprises a central atom $M_1$ and at least two different composition ligands A and D which are at least one of polyatomic or a lone halogen. Examples for $M_1A_jD_m$ are as described above.

Figure 9:
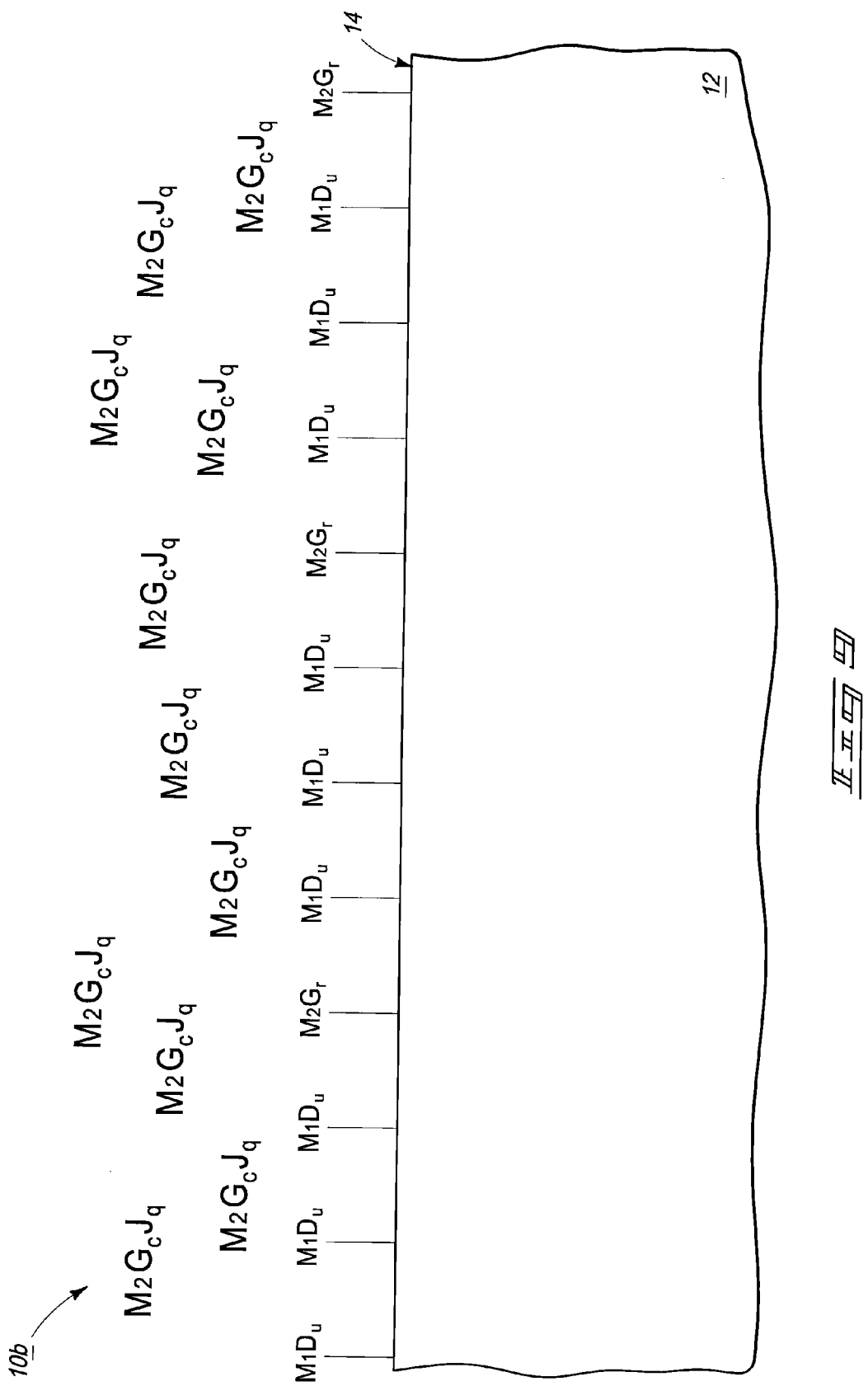
FIG. 9 is a view of the FIG. 8 substrate at a processing step subsequent to that of FIG. 8.

Second, and referring to FIG. 9, outermost surface 14 has been contacted with a second precursor $M_2G_cJ_q$ to chemisorb a second species $M_2G_r$ different from first species $M_1Du$ onto outermost surface 14 from the second precursor. The second precursor comprises a central atom $M_2$ which is different from the central atom of the first precursor, and at least two different composition ligands which are at least one of polyatomic or a lone halogen. In FIG. 9, such ligands are represented as "G" and "J" of quantity "c" and "q", respectively. Example ligands G and J are the same as any of those described in the above embodiments for A, D, and E. Suffixes "c" and "q" are greater than zero, may or may not be the same, and may or may not be integers. Additional composition ligands may be included as long as at least two are at least one of polyatomic or a lone halogen.

Figure 10:
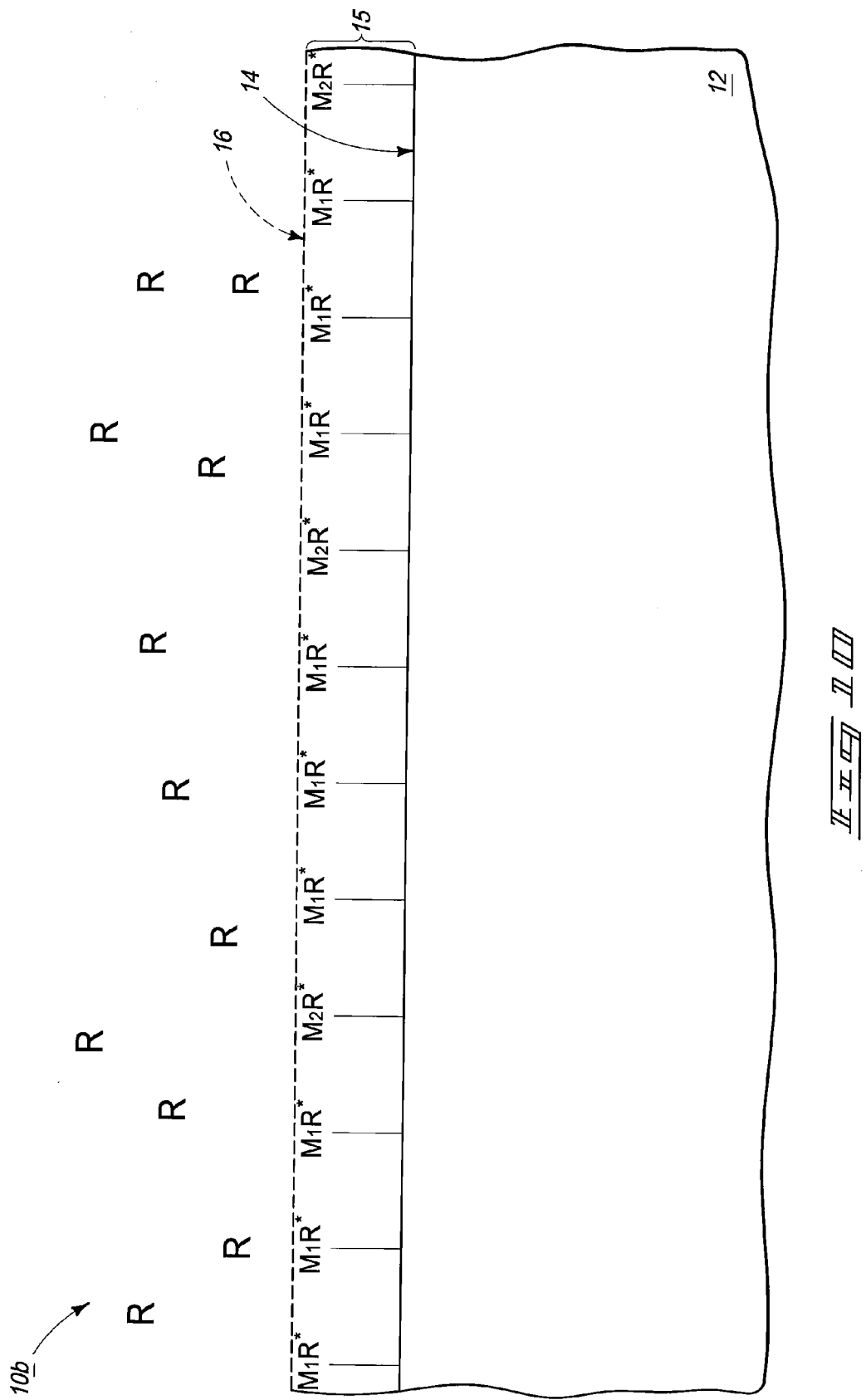
FIG. 10 is a view of the FIG. 9 substrate at a processing step subsequent to that of FIG. 9.

Third, and referring to FIG. 10, the chemisorbed first species (not shown) and the chemisorbed second species (not shown) have been contacted with a reactant R which reacts with the first species and with the second species to form a reaction product 15 and a new outermost surface 16 of substrate 10b. R may be the same as that described with respect to the above embodiments. Likewise, the reaction product may be the same or different as that of the above embodiments. Further, the iteration may be repeated one or more times whereby new outermost reaction product surfaces are created to ultimately achieve a suitable desired thickness of material over substrate material 12. Additionally and/or alternately, another precursor having the same or different central atom with respect to the first and second precursors could be used immediately before or after exposure to the reactant. Regardless, other processing may occur before or after any of the first, second, and third parts of the above iteration. Further, the reaction product of different iterations may be different depending on precursors which are used.

Embodiments of the invention may be used for achieving or tuning the physical structure of a deposited film, for example impacting crystallinity where crystalline material is being deposited or impacting resultant film stress. Such may also impact dielectric and leakage current properties of dielectric layers, or sheet resistance of metal layers.

Embodiments of the invention encompass methods of forming a capacitor, for example, as shown and described with respect to a substrate 30 in FIG. 11. Substrate 30 may or may not be a semiconductor substrate, and comprises substrate material 32 which may or may not be homogenous. A first capacitor electrode 34 and a second capacitor electrode 36 have been formed over substrate material 32. Any suitable conductive material may be used. Electrodes 34 and 36 may or may not be of the same thickness, may or may not be of the same composition, and may or may not be homogenous. A capacitor dielectric region 40 has been provided between first capacitor electrode 34 and second capacitor electrode 36.

Capacitor dielectric 40 may be provided by performing multiple iterations of the following temporally separated ALD-type sequence as described above. First, an outermost surface of the substrate is contacted with a first precursor to chemisorb a first species onto the outermost surface from the first precursor. For example and by way of example only, such could be conducted over first capacitor electrode material 34 prior to any deposition of second capacitor electrode material 36.

Second, the outermost surface is contacted with a second precursor to chemisorb a second species different from the first species onto the outermost surface from the second precursor. The first and second precursors comprise ligands and have different central atoms. At least one of the first and second precursors comprises at least two different composition ligands which are at least one of polyatomic or a lone halogen.

Third, the chemisorbed first species and the chemisorbed second species are contacted with a reactant which reacts with the first species and with the second species to form a reaction product new outermost surface of the substrate. Any of the processing described above with respect to the FIGS. 1-4, 5-7, and 8-10 embodiments are examples. The material deposited by the iteration may or may not be provided in direct physical touching contact with one or both of electrodes 34 or 36.

In one embodiment, and independent of the manner by which capacitor dielectric 40 is formed, at least one of the first and second capacitor electrodes is formed by performing multiple iterations of the following temporally separated ALD-type sequence as described above. First, an outermost surface of the substrate is contacted with a first precursor to chemisorb a first species onto the outermost surface from the first precursor. Second, the outermost surface is contacted with a second precursor to chemisorb a second species different from the first species onto the outermost surface from the second precursor. The first and second precursors comprise ligands and have different central atoms. At least one of the first and second precursors comprises at least two different composition ligands which are at least one of polyatomic or a lone halogen. Third, the chemisorbed first species and the chemisorbed second species are contacted with a reactant which reacts with the first species and with the second species to form a reaction product new outermost surface of the substrate. Any of the processing described above with respect to the FIGS. 1-4, 5-7, 8-10, and 11 embodiments are examples.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a material over a substrate comprising performing at least one iteration of the following temporally separated ALD-type sequence:
   contacting an outermost surface of a substrate with a first precursor to chemisorb a first species onto the outermost surface from the first precursor;
   contacting the outermost surface with a second precursor to chemisorb a second species different from the first species onto the outermost surface from the second precursor, the first and second precursors comprising ligands and having different central atoms, at least one of the first and second precursors comprising at least two different composition ligands, the two different composition ligands being polyatomic or a lone halogen; and
   contacting the chemisorbed first species and the chemisorbed second species with a reactant which reacts with the first species and with the second species to form a reaction product new outermost surface of the substrate.

2. The method of claim 1 wherein only one of the first and second precursors comprises at least two different composition ligands.

3. The method of claim 1 wherein the material comprises $Zr_xAl_yO_z$, one of the first or second precursors is tri(dimethylamino)cyclopentadienyl zirconium, the other of the first and second precursors is trimethyl aluminum, and the reactant comprises oxygen.

4. The method of claim 3 wherein the one is the first precursor and x is greater than y.

5. The method of claim 3 wherein the one is the second precursor and y is greater than x.

6. The method of claim 1 wherein the material comprises $Zr_xSi_yO_z$, one of the first or second precursors is tri(dimethylamino)cyclopentadienyl zirconium, the other of the first and second precursors is tri(dimethylamino)silane, and the reactant comprises oxygen.

7. The method of claim 6 wherein the one is the first precursor and x is greater than y.

8. The method of claim 6 wherein the one is the second precursor and y is greater than x.

9. A method of forming a material over a substrate comprising performing at least one iteration of the following temporally separated ALD-type sequence:
   contacting an outermost surface of a substrate with a first precursor to chemisorb a first species onto the outermost surface from the first precursor, the first precursor comprising a central atom and at least two different composition ligands, the two different composition ligands being polyatomic or a lone halogen;
   contacting the outermost surface with a second precursor to chemisorb a second species different from the first species onto the outermost surface from the second precursor, the second precursor comprising a central atom and ligands, the central atoms of the first and second precursors being different; and
   contacting the chemisorbed first species and the chemisorbed second species with a reactant which reacts with the first species and with the second species to form a reaction product new outermost surface of the substrate.

10. The method of claim 9 wherein all of the ligands of the second precursor are of the same composition.

11. The method of claim 9 wherein all of the ligands of the first precursor are of only two different compositions.

12. The method of claim 11 wherein the first species is void of one of the two different composition ligands.

13. The method of claim 11 wherein the first precursor has greater quantity of one of the two different composition ligands than the other of the two different composition ligands.

14. The method of claim 13 wherein the first species is void of the one ligand.

15. The method of claim 9 wherein the ligands of the first precursor are of more than two different compositions.

16. The method of claim 9 wherein one of the ligands in the first precursor is larger than each ligand in the second precursor.

17. The method of claim 9 wherein one of the different composition ligands in the first precursor is larger than all remaining ligands in the first precursor of different composition from the one, the first species comprising more of the one ligand than any of the remaining ligands.

18. The method of claim 17 wherein the first species is void of the remaining ligands.

19. The method of claim 18 wherein all of the ligands of the first precursor are of only two different compositions.

20. The method of claim 9 wherein at least one of the different composition ligands is a lone halogen.

21. The method of claim 20 wherein at least two of the different composition ligands are different lone halogens.

22. The method of claim 9 wherein at least one of the different composition ligands is polyatomic.

23. The method of claim 22 wherein the one is selected from the group consisting of alkyl, allyl, and alkoxy.

24. The method of claim 22 wherein the one is selected from the group consisting of amino, amido, and imido.

25. The method of claim 22 wherein the one is cyclic.

26. The method of claim 22 wherein at least two of the different composition ligands are polyatomic.

27. The method of claim 26 wherein none of the different compositions is a lone halogen.

28. The method of claim 9 wherein the first species retains only a single ligand from the first precursor, the single ligand being polyatomic and larger than all individual ligands of the second precursor.

29. The method of claim 28 wherein all individual ligands of the second precursor are smaller than the single polyatomic ligand.

30. The method of claim 29 wherein the single polyatomic ligand is cyclic.

31. The method of claim 9:
   wherein one of the ligands in the first precursor is larger than each ligand in the second precursor, the first species comprising the one ligand;
   using steric hindrance in forming the first species from the first precursor to reduce saturation of the central atom of the first precursor chemisorbed to the outermost surface than would otherwise occur under identical process conditions using a different first precursor not having said one ligand; and
   the forming of the second species from the second precursor increasing quantity of the central atom of the second precursor chemisorbed to the outermost surface than would otherwise occur when forming the first species under said identical process conditions using a different first precursor not having said one ligand.

32. The method of claim 31 wherein the first species retains only a single ligand from the first precursor, the single ligand being cyclic.

33. The method of claim 31 wherein all of the ligands of the second precursor are of the same composition and are not cyclic.

34. A method of forming a material over a substrate comprising performing at least one iteration of the following temporally separated ALD-type sequence:
  contacting an outermost surface of a substrate with a first precursor to chemisorb a first species onto the outermost surface from the first precursor, the first precursor comprising a central atom and ligands;
  contacting the outermost surface with a second precursor to chemisorb a second species different from the first species onto the outermost surface from the second precursor, the second precursor comprising a central atom and at least two different composition ligands, the two different composition ligands being polyatomic or a lone halogen, the central atoms of the first and second precursors being different; and
  contacting the chemisorbed first species and the chemisorbed second species with a reactant which reacts with the first species and with the second species to form a reaction product new outermost surface of the substrate.

35. A method of forming a material over a substrate comprising performing at least one iteration of the following temporally separated ALD-type sequence:
  contacting an outermost surface of a substrate with a first precursor to chemisorb a first species onto the outermost surface from the first precursor, the first precursor comprising a central atom and at least two different composition ligands, the two different composition ligands of the first precursor being polyatomic or a lone halogen;
  contacting the outermost surface with a second precursor to chemisorb a second species different from the first species onto the outermost surface from the second precursor, the second precursor comprising a central atom and at least two different composition ligands, the two different composition ligands of the second precursor being polyatomic or a lone halogen, the central atoms of the first and second precursors being different; and
  contacting the chemisorbed first species and the chemisorbed second species with a reactant which reacts with the first species and with the second species to form a reaction product new outermost surface of the substrate.

36. A method of forming a capacitor, comprising:
  forming first and second capacitor electrodes over a substrate; and
  providing a capacitor dielectric between the first and second capacitor electrodes, the providing of the capacitor dielectric comprising performing multiple iterations of the following temporally separated ALD-type sequence:
    contacting an outermost surface of the substrate with a first precursor to chemisorb a first species onto the outermost surface from the first precursor;
    contacting the outermost surface with a second precursor to chemisorb a second species different from the first species onto the outermost surface from the second precursor, the first and second precursors comprising ligands and having different central atoms, at least one of the first and second precursors comprising at least two different composition ligands, the two different composition ligands being polyatomic or a lone halogen; and
    contacting the chemisorbed first species and the chemisorbed second species with a reactant which reacts with the first species and with the second species to form a reaction product new outermost surface of the substrate.

37. A method of forming a capacitor, comprising:
  forming first and second capacitor electrodes and a capacitor dielectric there-between over a substrate, the forming of at least one of the first and second capacitor electrodes comprising performing multiple iterations of the following temporally separated ALD-type sequence:
    contacting an outermost surface of the substrate with a first precursor to chemisorb a first species onto the outermost surface from the first precursor;
    contacting the outermost surface with a second precursor to chemisorb a second species different from the first species onto the outermost surface from the second precursor, the first and second precursors comprising ligands and having different central atoms, at least one of the first and second precursors comprising at least two different composition ligands, the two different composition ligands being polyatomic or a lone halogen; and
    contacting the chemisorbed first species and the chemisorbed second species with a reactant which reacts with the first species and with the second species to form a reaction product new outermost surface of the substrate.

\* \* \* \* \*